Figure 1A:
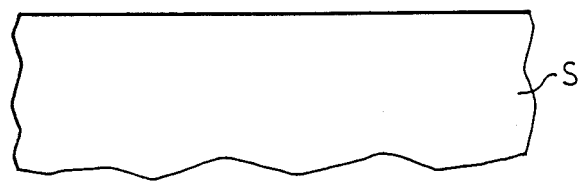

United States Patent [19]
Autier et al.

[11] Patent Number: 4,925,813
[45] Date of Patent: May 15, 1990

[54] METHOD OF MANUFACTURING SEMICONDUCTOR DEVICES INCLUDING AT LEAST A REACTIVE ION ETCHING STEP

[75] Inventors: Philippe Autier, Paris; Jean-Marc Auger, Joinville-le-Pont, both of France

[73] Assignee: U.S. Philips Corporation, New York, N.Y.

[21] Appl. No.: 366,107

[22] Filed: Jun. 13, 1989

[30] Foreign Application Priority Data

Jun. 24, 1988 [FR] France ................................ 88 08504

[51] Int. Cl.$^5$ ..................... H01L 21/00; H01L 21/02; H01L 21/285; C23F 1/00
[52] U.S. Cl. .................................... 437/228; 437/225; 437/905; 156/643; 156/646; 156/662; 148/DIG. 51; 148/DIG. 131; 204/192.32; 204/192.35; 252/372
[58] Field of Search ..................... 437/2, 5, 225, 228, 437/245, 905, 962; 148/DIG. 51, DIG. 56, DIG. 119, DIG. 131; 156/643, 646, 662; 204/192.32, 192.35; 357/16, 17; 372/43, 48; 252/372, 374, 376

[56] References Cited

U.S. PATENT DOCUMENTS

| | | | |
|---|---|---|---|
| 4,467,521 | 8/1984 | Spooner et al. | 437/176 |
| 4,771,017 | 9/1988 | Tobin et al. | 437/203 |
| 4,840,922 | 6/1989 | Kobayashi et al. | 437/129 |
| 4,861,423 | 8/1989 | Carriere et al. | 156/643 |

FOREIGN PATENT DOCUMENTS

0032675  3/1977  Japan ................................ 156/662

OTHER PUBLICATIONS

Furuya, F., Crystallographic Facets Chemically Etched in GaInAsP/InP for Integrated Optics, Electronic Letters, vol. 17, Aug. 20, 1981, pp. 582–583.
Aspnes, D., Chemical Etching and Cleaning Procedures for Si, Ge, and Some III–V Compound Semiconductors, Appl. Phys. Lett., 39(4), Aug. 15, 1981, pp. 316–318.
Bertrand, P., XPS Study of Chemically Etched GaAs and InP, J. Vac. Sci & Tech., 18(1), 1981, pp 28–33.
Adachi, S., InGaAsP/InP Buried-Heterostructure Lasers ($\lambda=5$ $\mu$m) with Chemically Etched Mirrors, J. Appl. Phys., 52(9), Sep. 1981, pp. 5843–5845.
DiLorenzo, J., An In-Situ Etch for the CVD Growth of GaAs: The 'He-Etch', Inst. Phys. Conf. Ser. No. 24, 1975, pp. 362–368.
Dobbs, B., A Technique for Uniform Etching of Polished Gallium Phosphide, J. Electrochem. Soc. (USA), vol. 125, No. 2, Feb. 1978, p. 347.
Kambayash, T., Chemical Etching of InP and GaInAsP for Fabricating Laser Diodes and Integrated Optical Circuits, Japanese Jour. of Appl. Phys., Jan. 1980, pp. 79–85.

*Primary Examiner*—Brian E. Hearn
*Assistant Examiner*—B. Everhart
*Attorney, Agent, or Firm*—Norman N. Spain

[57] ABSTRACT

A method of manufacturing semiconductor devices comprising at least a reactive ion etching step of a so-called substrate formed by semiconductor compounds having the general formulae $Ga_{1-x}As_xIn_{1-y}P_y$, in which formulae x and y are the concentrations and lie between 0 and 1, this method comprising for carrying out this etching step a masking system of the said substrate cooperating with a flow of reacting gases, characterized in that the masking system is formed by a first metallic layer of titanium (Ti) of small thickness, on which a second metallic layer of nickel (Ni) is disposed having a thickness of about ten times larger, and in that the flow of reacting gases is formed by the mixture of the gases $Cl_2/CH_4/H_2/Ar$, in which mixture $Cl_2$ is present in a quantity of about a quarter of the quantities of $CH_4$ and Ar, as far as the partial pressures in the etching chamber are concerned.

Application: Manufacture of optoelectronic devices of III–V materials.

2 Claims, 3 Drawing Sheets

METHOD OF MANUFACTURING SEMICONDUCTOR DEVICES INCLUDING AT LEAST A REACTIVE ION ETCHING STEP

The invention relates to a method of manufacturing semiconductor devices including at least a reactive ion etching step of a substrate constituted by a means chosen among:
- a solid wafer of a semiconductor compound having the general formula $Ga_{1-x}As_xIn_{1-y}P_y$,
- a succession of layers of semiconductor compounds each having the general formulae $Ga_{1-a}As_xIn_{1-y}P_y$, in which formulae x and y are the concentrations and lie between 0 and 1, this method comprising for carrying out this etching step a system for masking the said substrate cooperating with a flow of reacting gases.

The invention is used in the manufacture of integrated devices on $A_{III}$-$B_V$ materials and especially optoelectronic devices and III-V compounds including the element In. In fact, the material InP and the other III-V compounds, especially the III-V compounds containing the element In, are considered as materials which are very attractive for the manufacture of integrated optoelectronic devices operating at great wavelengths, such as 1.3 μm and 1.55 μm, which are the actual standards in telecommunication. For manufacturing said integrated devices, it is found to be necessary to use dry etching techniques, which are solely suitable to permit of obtaining micron or submicron patterns.

Such dry etching methods reproducibly should give patterns of high resolution. The etching should be
- anisotropycally in all crystallographic directions, and
- of morphology of the surface should be maintained.

Dry etching methods based on reactive ion etching, designated hereinafter as RIE, are known from the prior art.

In general, in these known methods a mask is formed to permit of etching patterns in the openings of the mask, and a mixture of reacting gases or a reacting gas cooperating with the choice of the materials constituting the mask is used in order to obtain a selective etching, i.e. to obtain etching of the masked material, typically a III-V material containing In without deteriorating the mask.

In optoelectronics, the problems actually arising generally consist in making attempts to form submicron patterns etched over a great depth, at least more than 3 μm, and most frequently of the order of 7 μm.

Said problems arise in the case in which curved buried guides should be obtained, which have in the curved part an etched groove used for lateral confinement. These problems further arise when a mirror should be obtained constituted by a groove forming a plate having parallel surfaces formed through the section of a buried optical guide. In this case, it is particularly important to obtain an etched groove which has edges which are completely flat, smooth and perpendicular to the axis of the guide, i.e. to the substrate.

Such devices are described in the publication entitled: "Probleme der Topographie Integriert-Optischer Schaltungen" by Karl-Heinz Tietgen in "2213 Frequenz, Vol. 35 (1981), September No. 9, Berlin Deutschland". In said publication however no mention is made of methods of manufacturing the said devices.

Said problems also arise in the case of the manufacture of buried optoelectronic or electronic devices, in which access should be obtained to the deep layers of the devices, for example access to the substrate, when it is covered with a given number of epitaxial layers. In this case, it is particularly important to obtain a hole having a bottom which is very plane and very smooth, because this flat bottom is generally intended to serve as a base for new epitaxial layers.

Finally, although the III-V compounds have numerous resemblances, they also have with respect to the reacting gases, which can be used in dry etching, numerous dissemblances of chemical nature, which are especially due to the fact that one of their elements can form with the relevant reacting gas a volatile compound.

Therefore, the teaching derived from the prior art, whcih can be applied to a specific III-V compound, cannot be systematically transposed to another III-V compound.

A method of manufacturing using a dry etching step of the RIE type to obtain all the characteristics mentioned above is known from the publication entitled: "A Novel Process for RIE on InP, using $CH_4/H_2$" by U. Niggebrügge, M. Klug and G. Garus, in "Inst. Phys. Conf. Ser. No. 79, Chapter 6, Paper presented at Int. Symp. GaAs and Related Compounds", Karuizawa, Japan-1985. This document describes a method of obtaining dry etching by RIE of the InP compound utilizing the mixture of $CH_4$ and $H_2$ as reacting gas. This mixture is used to avoid problems of corrosion of the vacuum system and especially because these gases permit of obtaining a reasonable etching rate of the InP material. With optimized parameters of the mixture of gases and of their operating conditions, the method described permits of obtaining etching edges having little roughness and an inclination of 85% during the manufacture of ribbon guides.

These results have been obtained by the cooperation between the choice of the reacting gases $CH_4/H_2$ and of a masking process consisting in that for the deep etching steps a layer of $SiO_2$ is formed, which can be covered with photoresist, or in that a single photoresist layer is formed for the etching steps of small depth. The publication mentions the effect of cooperation between gases and mask, which consists in that at the surface of the mask a layer of hydrides and polymers is formed, which results in that the mask is cured and its resistance to erosion is increased.

In spite of the optimized conditions and the effect on the mask, the results obtained by the known method are not sufficiently satisfactory to be applied to the manufacture of electronic devices, in which an etching depth of at least 7 μm and etching edges absolutely perpendicular to the substrate are required for submicron patterns in a III-V compound including indium (In). Especially, the inclination of the etching edges obtained of 85% according to this publication is much too large if it is applied to submicron patterns etched over a depth of 7 μm. This is due to the fact that during an etching step of the same duration as that which permits of obtaining a depth of 7 μm, the mask of dielectric material, in spite of the formation of the layer of hydrides, is fairly strongly attacked laterally to ensure that the inclination of the etching edges becomes different from 100%. Moreover, it has been found that the bottom of the holes etched according to the method indicated by the aforementioned document is not sufficiently smooth to permit, for example, of subsequently depositing other layers.

Therefore, the invention has for its object to provide a method as mentioned in the opening paragraph, which permits of obtaining deep etchings of at least 7 μm, etching edges which are smooth and perfectly perpendicular to the substrate and micron patterns and even submicron patterns (0.7 μm) which can be applied to III-V compounds, such as GaAs, as well as to III-V compounds including the element indium, such as InP.

According to the invention, the method is characterized in that the masking system is formed by a first metallic layer of titanium (Ti) of small thickness, on which is disposed a second metallic layer of nickel (Ni) having a ten times larger thickness, and in that the flow of reacting gases is formed by the mixture of the gases $Cl_2/CH_4/H_2/Ar$, in which mixture $Cl_2$ is present in a quantity of a quarter of the quantities of $CH_4$ and Ar, as far as the partial pressures in the etching chamber are concerned.

Figure 1B:
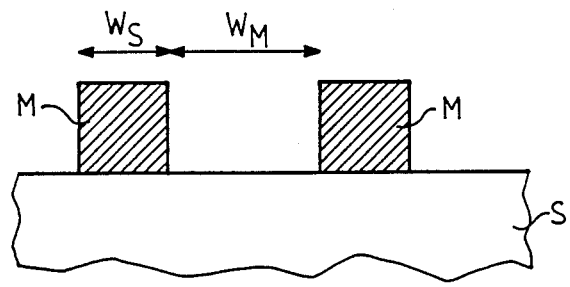
Figure 1C:
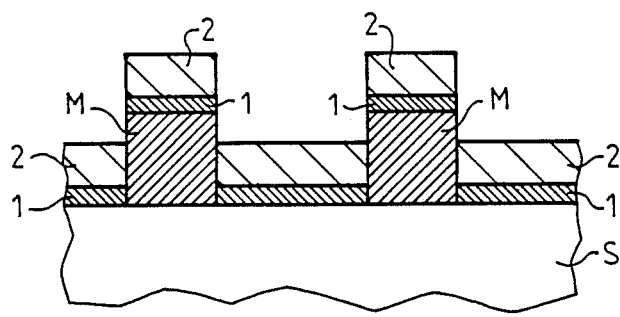
Figure 1D:
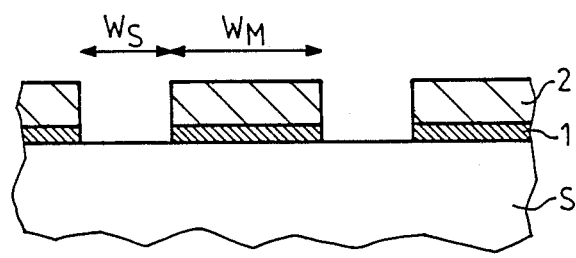
Figure 1E:
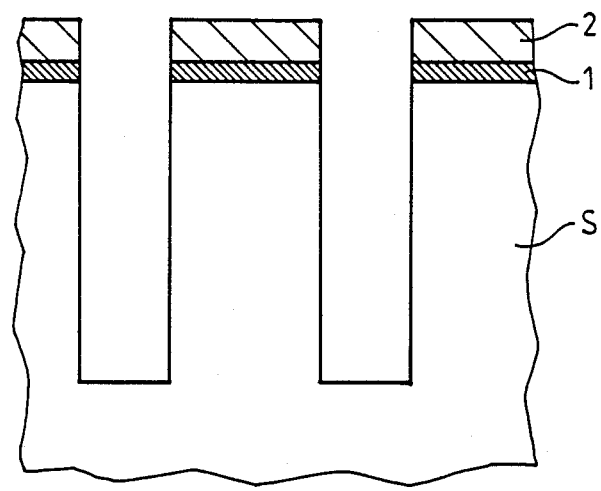
Figure 1F:
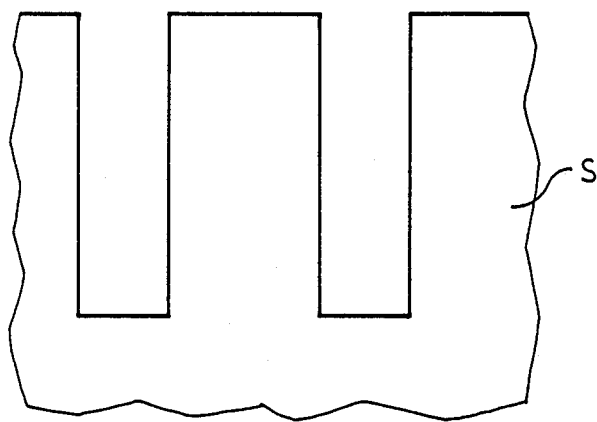
Figure 2:
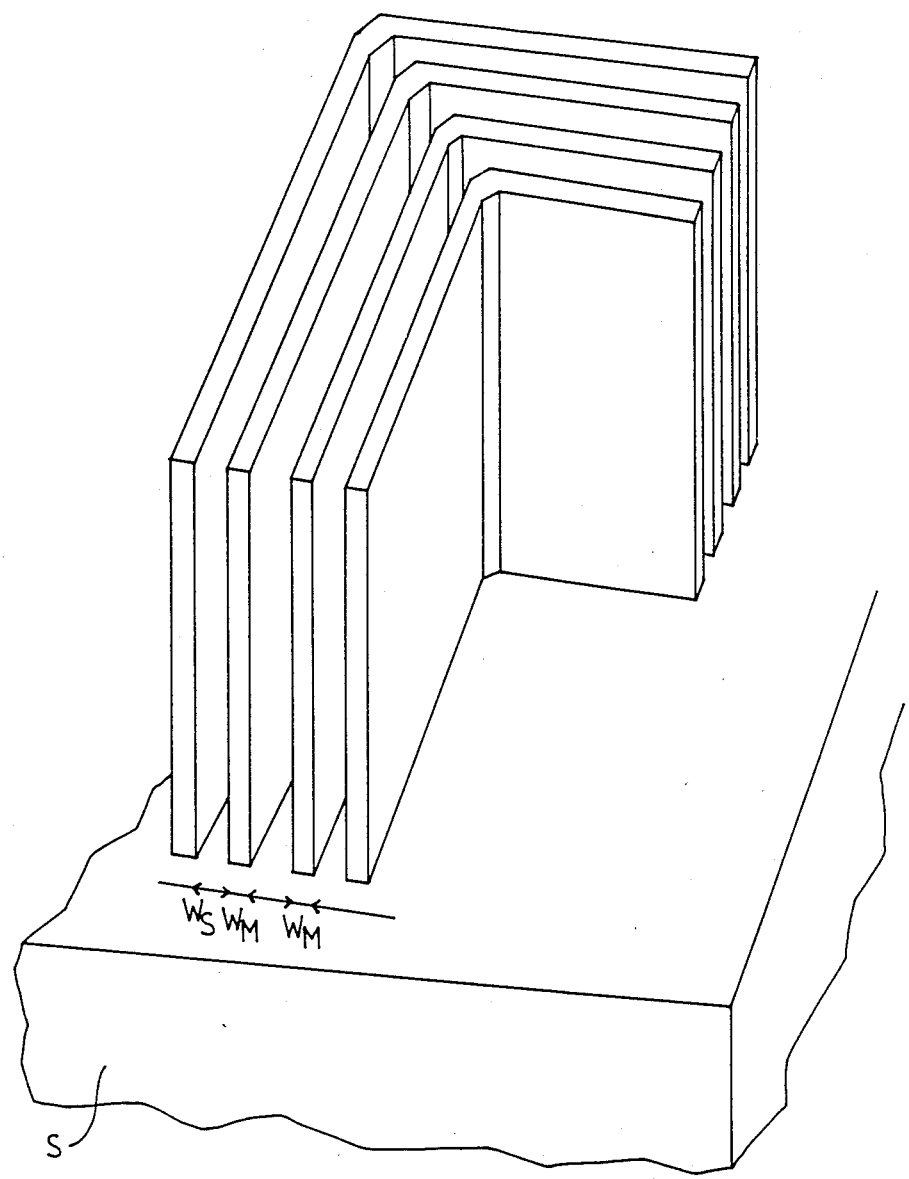

The invention will be described, by way of example, more fully with reference to the accompanying drawings, in which:

FIGS. 1a to 1f show in a simplified sectional view a device at the different stages of manufacturing according to the invention, FIG. 2 shows in a perspective view an experimental embodiment bringing to light the performances of the method according to the invention.

The method according to the invention, will be carried out by the steps described hereinafter:

(a) preparing a wafer S of a substrate to be etched. This wafer may be any wafer of a semiconductor compound of the III-V group having the general formula $Ga_{1-x}As_xIn_{1-y}P_y$, where x and y are concentrations lying between 0 and 1 (cf. FIG. 1a). It may also be a succession of alternate layers of these materials obtained, for example by epitaxy and forming homostructures or heretostructures.

(b) forming by means of a photosensitive resin a mask M having openings disposed at the surface of the regions of the substrate which must be protected during the reactive ion etching step; these openings are therefore disposed in the regions which will later be masked for RIE (cf. FIG. 1b).

As photosensitive resins, the Az 4070 or Az 5214 (manufactured by Shipley) or RB 2000N (manufactured by Hitachi-Raycast) can be used. For this purpose, it is profitable to read the publication of "West et alii, Jour. Vac. Sci.-Technol. B5 (1), 1987, pp. 449-453". With such resins, by the photolithography methods known to these skilled in the art patterns can be defined having dimensions of 0.5 to 1 μm.

For example by experiments, it is possible to realize lattices having grooves of 1.3 μm width separated from each other by walls having a thickness of 0.7 μm, or conversely, ot lattices of walls alternating with grooves of the order of each 1 μm. and in a general manner lattices, of which one element is of micron or submicron dimensions at a pitch of the order of 2 μm.

For application in integrated optoelectronic circuits, any form of micron or submicron patterns can then be obtained due to the performances obtained.

Thus, in the embodiment illustrated by the sectional views 1a to 1f, the choice is made to form a lattice having grooves of $W_S=0.7$ μm and walls of $W_M=1.3$ μm.

In the embodiment illustrated in perspective view in FIG. 2, on the contrary grooves are formed of $W_S=1.3$ μm and walls of $W_M=0.7$ μm. Even a complex pattern is obtained, in which the walls are turned through an angle of 90°.

In one and the other of these embodiments, the setching depth is p=7 μm.

This pattern is obtained at this stage in negative form by means of the resin chosen, as shown in FIG. 1b. For etching submicron patterns, the thickness of the deposited resin must be $e_M \sim 0.7$ μm.

(c) depositing by evaporation in vacuo by means of an electron gun a first metallic layer 1 of titanium (Ti) having a thickness $e_1$ lying between 30 and 50 nm followed in the same evaporation chamber, simply by changing the target, by depositing a second metallic layer 2 of nickel (Ni) having a thickness $e_2$ lying between 200 and 300 nm, i.e. about 8 to 10 times thicker than the first metallic layer 1 (cf. FIG. 1c).

However, the thicknesses $e_1$ and $e_2$ are chosen so that the sum of the thicknesses $e_1 + e_2 < e_M$ in order that the layer M in a subsequent stage can readily be attacked (cf. FIG. 1c).

The superimposition of the two metallic layers 1 and 2 will constitute the masking system for the reactive ion etching step according to the invention. The advantage of this masking system are:

its simplicity of realization=a simple evaporation in vacuo in a single operation of two current metals and its resistance to any reacting gas. The titanium layer arranged as a sublayer, whose function will be described below, is limited to a very small thickness because titanium yields with chlorine volatile $TiCl_2$ compounds. The nickel layer arranged as an upper layer, whose thickness is preponderant because it is about ten times larger than that of the titanium layer, on the contrary has a very high resistance to erosion, especially with respect to chlorine, and also to vertical erosion and to lateral erosion.

(d) Eliminating the layer M of resin, for example by boiling acetone, permitting the lift-off of the undesired parts of the layers 1 and 2, which are deposited at the surface of the parts of the layer M (cf. FIG. 1d).

(e) Etching the semiconductor material designated as substrate S in the openings of the mask formed by the superimposed layers 1 and 2. This etching treatment is effected according to the invention by an etching step of the RIE type known per se to those skilled in the art by means of gases which are chosen in accordance with the invention in the following mixture: $Cl_2/CH_4/H_2/Ar$, these gases acting at the partial pressures of 1-4-24-4 for each of them, respectively, in the mixture.

The power is 120 W.

The overall pressure is 40 mtorr.

This mixture of gases has been chosen specially to cooperate with the formation of the layers 1 and 2 in order to attain the objects of the invention.

In fact, as can be seen, if a compound containing the element In should be etched, the use of pure chlorine is excluded. This gas used in the pure state is compatible only with the etching of GaAs, as is indicated by the second document described as prior art.

On the other hand, the choice of $CH_4/H_2$ as etching gas of InP is known from the first document mentioned leads to too low etching rates for industrial applications. In fabrication, the etching rates must be high without the rapidity of manufacture adversely affecting the quality. It can be seeon that the selection effected according to the invention in the concentrations or in the partial pressures of the reacting gases leads to a high etching rate and at the same time to an excellent manufacturing quality, which results in a high manufacturing efficiency.

The etching step can be effected over a depth of 7 $\mu$m without adversely affecting the expected quality (cf. FIGS. 1e and 2).

(f) Lift-off of the metallic layers 1 and 2 forming the masking system used beforefor the RIE etching step. In this lift-off step, the layer 1 of titanium plays a part. In fact, if the nickel forming the layer 2 can be eliminated only with great difficulty by acids otherwise chosen so as not to deteriorate the surface of the substrate, on the other hand the titanium layer covered itself by the thick layer of nickel is eliminated in 3 to 10 minutes in pure or slightly diluted hydrofluoride at room temperature. The elimination of the layer 1 of titanium then brings about the elimination of the layer 2 of nickel (cf. FIG. 1f).

In view of the function of the titanium layer, the invention can be carried out by replacing for the layer 1 titanium by any metal having the same properties, i.e. exhibiting a simple deposition, being readily eliminated in hydrofluoric acid or another acid not attacking the substrate and having a sufficient resistance to the mixture of gases $Cl_2/CH_4/H_2/Ar$ used for the reactive ion etching (RIE) step.

Likewise, the nickel can be replaced so that the second metallic layer is formed by any metal having the same properties, i.e. the simplicity of deposition and the high resistance to erosion by the preferred gas mixture.

We claim:

1. A method of manufacturing semiconductor devices including at least a reactive ion etching step of a substrate constituted by a means chosen among:

a solid wafer of a semiconductor compound having the general formula $Ga_{1-x}As_xIn_{1-y}P_y$, a succession of layers of semiconductor compounds each having the general formulae $Ga_{1-x}As_xIn_{1-y}P_y$, in which formulae x and y are the concentrations and lie between 0 and 1, this method comprising for carrying out this etching step a masking system of the said substrate cooperating with a flow of reacting gases, characterized in that the masking system is formed by a first metallic layer of titanium (Ti) having a small thickness, on which a second metallic layer of nickel (Ni) is disposed having a thickness about ten times larger, and in that the flow of reacting gases is formed by the mixture of the gases $Cl_2/CH_4/H_2/Ar$, in which mixture $Cl_2$ is present in a quantity of about a quarter of the quantities of $CH_4$ and Ar as far as the partial pressures in the etching chamber are concerned.

2. A method as claimed in claim 1, in which the masking system and the gas mixture are obtained by the succession of the following steps:

(a) forming a semiconductor substrate S chosen among a wafer of a compound $Ga_{1-x}As_xIn_{1-y}P_y$, or such a wafer moreover provided with epitaxial layers of such compounds, in whose general formula x and y are concentrations lying between 0 and 1;

(b) depositing at the surface of the said substrate a layer M of a negative resin and forming by photolithography in this resin openings disposed in coincidence with the regions of the substrate S which must be protected during the etching treatment to constitute predetermined patterns, the thickness of the layer M being of the order of 0.7 $\mu$m;

(c) depositing by evaporation in vacuo a first metallic layer of titanium (Ti) having a thickness of about 30 to 50 nm, followed by depositing, for example, in the same chamber by evaporation in vacuo a second metallic layer of nickel (Ni) having a thickness about eight to ten times larger than that of the first metallic layer, i.e. of about 300 to 500 nm;

(d) eliminating the layer M of resin, for example by means of boiling acetone taking along the undesired parts of the first metallic layer and of the second metallic layer and causing the appearance in the system formed by the superimposition of the two metallic layers of openings disposed in coincidence with the regions of the substrate which must be etched, thus constituting the masking system of the said substrate S for the reactive ion etching treatment;

(e) etching the said substrate S through the openings of the masking system thus constituted by the so-called reactive ion etching method known per se by means of the mixture of the gases $Cl_2/CH_4/H_2/Ar$ (chlorine, methane, hydrogen, argon), whose partial pressures are in the respective ratios 1-4-24-4;

(f) eliminating the said first and second metallic layers forming masking system by a so-called lift-off method consisting in attacking the first metallic layer of titanium (Ti) by means of pure or slightly diluted hydrofluoride (HF) at the ambient temperature for 3 to 10 minutes, the elimination of the first metallic layer at the same time leading to the elimination of the second metallic layer.

* * * * *